(12) United States Patent
Wang et al.

(10) Patent No.: US 9,396,993 B2
(45) Date of Patent: Jul. 19, 2016

(54) DEVICE HAVING REDUCED PAD PEELING DURING TENSILE STRESS TESTING AND A METHOD OF FORMING THEREOF

(71) Applicant: Semiconductor Manufacturing International (Shanghai) Corporation, Shanghai (CN)

(72) Inventors: Xinpeng Wang, Shanghai (CN); Chenglong Zhang, Shanghai (CN); Ruixuan Huang, Shanghai (CN)

(73) Assignee: SEMICONDUCTOR MANUFACTURING INTERNATIONAL (SHANGHAI) CORPORATION (CN)

( * ) Notice: Subject to any disclaimer, the term of this patent is extended or adjusted under 35 U.S.C. 154(b) by 0 days.

(21) Appl. No.: 14/256,241

(22) Filed: Apr. 18, 2014

(65) Prior Publication Data

US 2014/0374911 A1 Dec. 25, 2014

(30) Foreign Application Priority Data

Jun. 19, 2013 (CN) .......................... 2013 1 0244627

(51) Int. Cl.
*H01L 21/768* (2006.01)
*H01L 23/00* (2006.01)

(52) U.S. Cl.
CPC ............ *H01L 21/7685* (2013.01); *H01L 24/03* (2013.01); *H01L 24/05* (2013.01); *H01L 2224/03831* (2013.01); *H01L 2224/05012* (2013.01); *H01L 2224/05014* (2013.01); *H01L 2224/05016* (2013.01); *H01L 2224/05018* (2013.01); *H01L 2224/05082* (2013.01); *H01L 2224/05124* (2013.01); *H01L 2224/05166* (2013.01); *H01L 2224/05181* (2013.01); *H01L 2224/05567* (2013.01); *H01L 2224/05624* (2013.01); *H01L 2924/00014* (2013.01); *H01L 2924/35121* (2013.01)

(58) Field of Classification Search
CPC ....................................................... H01L 24/04
USPC .................................. 257/763–768; 438/612
See application file for complete search history.

(56) References Cited

U.S. PATENT DOCUMENTS

| | | | |
|---|---|---|---|
| 6,208,009 B1* | 3/2001 | Kravtchenko et al. ........ | 257/533 |
| 6,350,667 B1* | 2/2002 | Chen et al. .................... | 438/612 |
| 6,960,831 B2* | 11/2005 | Burrell et al. ................. | 257/751 |
| 2004/0188378 A1* | 9/2004 | Wu ......................... | H01L 24/11 216/13 |
| 2005/0006759 A1* | 1/2005 | Huang .......................... | 257/734 |
| 2006/0091536 A1* | 5/2006 | Huang et al. .................. | 257/734 |
| 2006/0125118 A1* | 6/2006 | Yamazaki ............... | H01L 24/03 257/784 |
| 2008/0006951 A1* | 1/2008 | Hebert .................... | H01L 24/03 257/786 |
| 2012/0064712 A1* | 3/2012 | Lei et al. ....................... | 438/614 |
| 2012/0098124 A1* | 4/2012 | Wu et al. ....................... | 257/737 |
| 2012/0129335 A1* | 5/2012 | Ikumo et al. ................. | 438/614 |
| 2013/0320524 A1* | 12/2013 | Chuang et al. ................ | 257/737 |

* cited by examiner

*Primary Examiner* — Christine Enad
(74) *Attorney, Agent, or Firm* — Innovation Counsel LLP

(57) ABSTRACT

The present disclosure relates to a method for forming a semiconductor device. The method includes forming a first aluminum pad layer on a metal layer, forming an adhesion layer on the first aluminum pad layer, etching the adhesion layer so as to form a patterned adhesion layer, and forming a second aluminum pad layer on the first aluminum pad layer and the patterned adhesion layer.

20 Claims, 4 Drawing Sheets

DEVICE HAVING REDUCED PAD PEELING DURING TENSILE STRESS TESTING AND A METHOD OF FORMING THEREOF

CROSS-REFERENCE TO RELATED APPLICATION

This application claims priority to Chinese Patent Application No. 201310244627.7 filed on Jun. 19, 2013 and entitled "Method for Preventing Pad Peeling During Test of CPI and Device Produced Therefrom", which is incorporated herein by reference in its entirety.

TECHNICAL FIELD

The present disclosure generally relates to a device having reduced bond pad peeling during tensile stress testing and a method of forming thereof.

DESCRIPTION OF THE RELATED ART

A semiconductor device may include aluminum bond pads formed from an aluminum pad layer. During tensile stress testing of the semiconductor device, an aluminum pad layer having poor adhesion to an underlying metal layer may be peeled off, thereby creating a gap between the aluminum pad layer and the underlying metal layer. The gap may affect the electrical properties and reliability of the semiconductor device.

FIG. 1A is a cross section view illustrating a semiconductor device disposed in a tensile stress testing apparatus.

Referring to FIG. 1A, the semiconductor device may include an aluminum pad layer 3 bonded to a metal layer 4 at a bonding interface 1. The tensile stress testing apparatus is configured to apply a tensile stress, so as to test the tensile strength of the semiconductor device.

FIG. 1B is a cross section view illustrating peeling of the aluminum pad layer 3 when a tensile stress is applied to the semiconductor device of FIG. 1A.

Referring to FIG. 1B, a tensile force of 3g may be applied to the aluminum pad layer 3 perpendicular to the bonding interface 1. In some instances, the tensile force of 3g may cause about 15% of the aluminum pad layer 3 to peel off from the metal layer 4 at the bonding interface 1. As shown in FIG. 1B, a gap 2 is formed in the bonding interface 1 between the aluminum pad layer 3 and the metal layer 4. The gap 2 may affect the electrical connection between the aluminum pad layer 3 and the metal layer 4, and impact the reliability of the semiconductor device.

The aluminum pad layer 3 may peel off from the metal layer 4 during the tensile stress test due to one or more of the following reasons. For example, there may be poor adhesion between the aluminum pad layer 3, the metal layer 4, and any intervening layers (for example, an oxide layer, or an adhesion layer comprising titanium nitride). Also, the tensile stress applied during testing may be transferred to the bonding interface 1 without attenuation.

Accordingly, there is a need to (1) improve the adhesion between the aluminum pad layer and the underlying metal layer, and/or (2) attenuate the tensile stress from the bonding interface during tensile stress testing.

SUMMARY

The present disclosure is directed to address at least the above issues relating to the peeling of an aluminum pad layer from an underlying metal layer during tensile stress testing of a semiconductor device.

According to some embodiments of the inventive concept, a method for forming a semiconductor device is provided. The method includes forming a first aluminum pad layer on a metal layer, forming an adhesion layer on the first aluminum pad layer, etching the adhesion layer so as to form a patterned adhesion layer, and forming a second aluminum pad layer on the first aluminum pad layer and the patterned adhesion layer.

In some embodiments, a thickness of the first aluminum pad layer may be about ⅕ to about ⅓ of a total thickness of the first aluminum pad layer and the second aluminum pad layer.

In some embodiments, the adhesion layer may include titanium, tantalum, tantalum nitride, or a combination thereof.

In some embodiments, the adhesion layer may be etched using a wet etching process.

In some embodiments, the wet etching process may include an alkali solution having a $H_2O_2$ additive, and the wet etching process may have an etch rate of about 20 A-100 A/min.

In some embodiments, the adhesion layer may be etched using a dry etching process.

In some embodiments, the dry etching process may include a fluorine-containing chemical substance.

In some embodiments, the fluorine-containing chemical substance may include at least one of $CF_4$, $CHF_3$, and $CH_2F_2$.

In some embodiments, a thickness of the adhesion layer may be about 5 nm to about 50 nm.

In some embodiments, the method may further include repeatedly stacking a plurality of the first aluminum pad layers, a plurality of the patterned adhesion layers, and a plurality of the second aluminum pad layers.

According to some other embodiments of the inventive concept, a semiconductor device is provided. The semiconductor device includes a first aluminum pad layer formed on a metal layer, a patterned adhesion layer formed on the first aluminum pad layer, and a second aluminum pad layer formed on the first aluminum pad layer and the patterned adhesion layer.

In some embodiments, a thickness of the first aluminum pad layer may be about ⅕ to about ⅓ of a total thickness of the first aluminum pad layer and the second aluminum pad layer.

In some embodiments, the patterned adhesion layer may include titanium, tantalum, tantalum nitride, or a combination thereof.

In some embodiments, the patterned adhesion layer may be formed using a wet etching process.

In some embodiments, the wet etching process may include an alkali solution having a $H_2O_2$ additive, and the wet etching process may have an etch rate of about 20 A-100 A/min.

In some embodiments, the patterned adhesion layer may be formed using a dry etching process.

In some embodiments, the dry etching process may include a fluorine-containing chemical substance.

In some embodiments, the fluorine-containing chemical substance may include at least one of $CF_4$, $CHF_3$, and $CH_2F_2$.

In some embodiments, a thickness of the patterned adhesion layer may be about 5 nm to about 50 nm.

In some embodiments, the semiconductor device may include a plurality of the first aluminum pad layers, a plurality of the patterned adhesion layers, and a plurality of the second aluminum pad layers repeatedly stacked.

BRIEF DESCRIPTION OF THE DRAWINGS

Further features and advantages of the inventive concept will be apparent from the following description with refer

DETAILED DESCRIPTION

Various embodiments of the inventive concept will be described in detail with reference to the drawings. The same reference numbers are used to designate the same components throughout the drawings. It is noted that the scope of the inventive concept is not limited to the described embodiments, but may include various modifications to the described embodiments.

First, a method of forming an exemplary semiconductor device will be described with reference to FIGS. 2A to 2C, which depict the exemplary semiconductor device at different stages of fabrication.

Figure 2A:
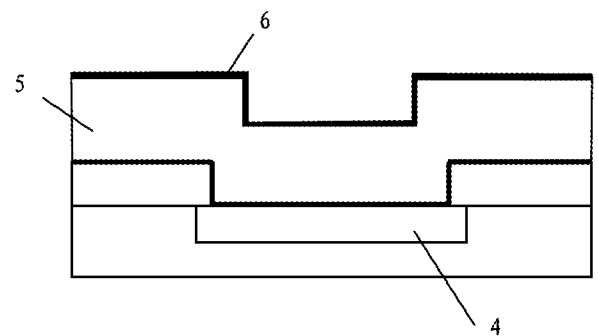
FIGS. 2A to 2C depict cross section views of an exemplary semiconductor device according to the inventive concept at different stages of fabrication.
Figure 2B:
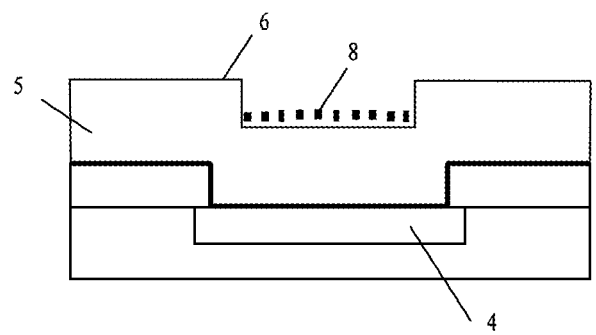

Referring to FIG. 2A, a first aluminum pad layer 5 is formed on a metal layer 4, and an adhesion layer 6 is then formed on the first aluminum pad layer 5. Next, as shown in FIG. 2B, the adhesion layer 6 is etched so as to form a patterned adhesion layer 8. Next, as shown in FIG. 2C, a second aluminum pad layer 7 is formed on the first aluminum pad layer 5 and the patterned adhesion layer 8.

In some embodiments, a thickness of the first aluminum pad layer 5 may be about ⅕ to about ⅓ of a total thickness of the first aluminum pad layer 5 and the second aluminum pad layer 7.

In some embodiments, the adhesion layer 6 (or patterned adhesion layer 8) may include titanium, tantalum, tantalum nitride, or a combination thereof. In some embodiments, the adhesion layer 6 may be deposited on the first aluminum pad layer 5 more than once, so as to increase a thickness of the adhesion layer 6.

In some embodiments, a wet etching process may be used to etch the adhesion layer 6 so as to form the patterned adhesion layer 8.

In some embodiments, the wet etching process may include using an alkali solution having a $H_2O_2$ additive as an etchant, and the wet etching process may have an etch rate of about 20 A-100 A/min.

In some embodiments, a dry etching process may be used to etch the adhesion layer 6 so as to form the patterned adhesion layer 8.

In some embodiments, the dry etching process may include using a fluorine-containing chemical substance as an etchant.

In some embodiments, the fluorine-containing chemical substance may include $CF_4$, $CHF_3$, $CH_2F_2$, or other chemical substances having similar etching functions. In some embodiments, the dry etching process may include using a non-chlorine containing chemical substance, such as $CL_2$ or $BCL_3$.

In some embodiments, a thickness of the adhesion layer may range from about 5 nm to about 50 nm.

Figure 3A:
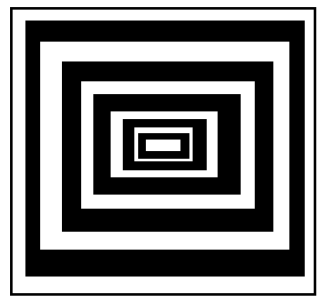
FIGS. 3A and 3B depict plan views of a patterned adhesion layer according to different embodiments of the inventive concept.
Figure 3B:
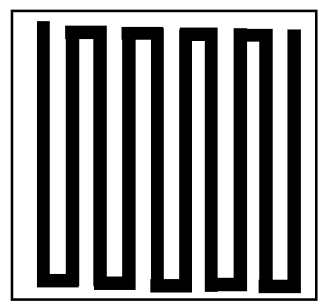

FIGS. 3A and 3B depict plan views of a patterned adhesion layer according to different embodiments of the inventive concept.

Referring to FIG. 3A, the patterned adhesion layer may be formed as annular patterns (where imaginary diagonal lines intersect corner points of the annular patterns). Referring to FIG. 3B, the patterned adhesion layer may be formed as a serpentine line pattern. In some embodiments, the patterned adhesion layer 8 may include dispersed dots, round patterns, or any other random pattern.

Figure 2C:
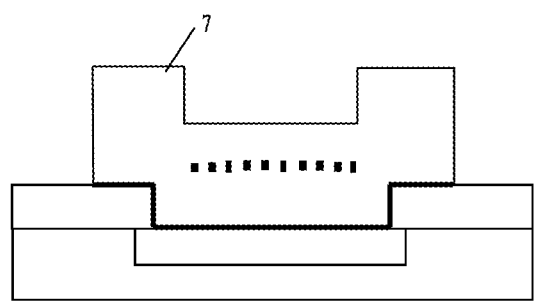

Next, the exemplary semiconductor device of FIG. 2C is described. The exemplary semiconductor device includes a first aluminum pad layer 5 formed on a metal layer 4, a patterned adhesion layer 8 formed on the first aluminum pad layer 5, and a second aluminum pad layer 7 formed on the first aluminum pad layer 5 and the patterned adhesion layer 8.

In some embodiments of the exemplary semiconductor device, a thickness of the first aluminum pad layer may be about ⅕ to about ⅓ of a total thickness of the first aluminum pad layer 5 and the second aluminum pad layer 7.

In some embodiments of the exemplary semiconductor device, the adhesion layer may include titanium, tantalum, tantalum nitride, or a combination thereof. In some embodiments, the adhesion layer 6 may be deposited on the first aluminum pad layer 5 more than once, so as to increase a thickness of the adhesion layer 6.

In some embodiments of the exemplary semiconductor device, the patterned adhesion layer 8 may be formed using a wet etching process.

In some embodiments of the exemplary semiconductor device, the wet etching process for forming the patterned adhesion layer 8 may include an alkali solution having a $H_2O_2$ additive, and the wet etching process may have an etch rate of about 20 A-100 A/min.

In some embodiments of the exemplary semiconductor device, the patterned adhesion layer 8 may be formed using a dry etching process.

In some embodiments of the exemplary semiconductor device, the dry etching process for forming the patterned adhesion layer 8 may include a fluorine-containing chemical substance.

In some embodiments of the exemplary semiconductor device, the fluorine-containing chemical substance may include $CF_4$, $CHF_3$, $CH_2F_2$, or other chemical substances having similar etching functions. In some embodiments, the dry etching process may include using a non-chlorine containing chemical substance such as $CL_2$ or $BCL_3$.

In some embodiments of the exemplary semiconductor device, a thickness of the adhesive layer may range from about 5 nm to about 50 nm.

The patterned adhesion layer 8 in the exemplary semiconductor device may be formed having different patterns. For example, in some embodiments, the patterned adhesion layer 8 may be formed as annular patterns (where imaginary diagonal lines intersect corner points of the annular patterns), as illustrated in FIG. 3A. In other embodiments, the patterned adhesion layer 8 may be formed as a serpentine line pattern, as illustrated in FIG. 3B. In some other embodiments, the patterned adhesion layer 8 may include dispersed dots, round patterns, or any other random pattern.

In some embodiments, the exemplary semiconductor device may include a plurality of patterned adhesion layers 8 embedded between a plurality of aluminum pad layers (e.g. a plurality of first aluminum pad layers 5 and second aluminum pad layers 7). For example, the exemplary semiconductor device may be formed by repeatedly stacking the semiconductor structure illustrated in FIG. 2C.

Figures 1A, 1B:
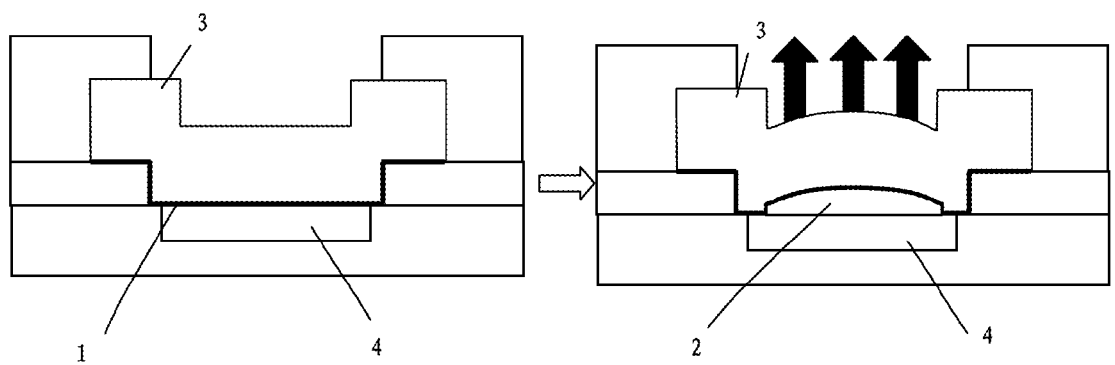
- FIG. 1A is a cross section view illustrating a semiconductor device disposed in a tensile stress testing apparatus.
FIG. 1B is a cross section view illustrating peeling of the aluminum pad layer when a tensile stress is applied to the semiconductor device of FIG. 1A.

Unlike the semiconductor device in FIG. 1A, the exemplary semiconductor device in FIG. 2C includes two aluminum pad layers (first aluminum pad layer 5 and second aluminum pad layer 7), with the patterned adhesion layer 8 disposed between the two aluminum pad layers 5 and 7. Accordingly, the exemplary semiconductor device in FIG. 2C has improved structural integrity compared to the semiconductor device in FIG. 1A. The improved structural integrity allows the tensile force applied during tensile stress testing to be efficiently dispersed throughout the exemplary semiconductor device. Accordingly, the stress transferred to the bonding interface between the aluminum pad layer and the underlying metal layer is attenuated, thereby reducing aluminum pad layer peeling at the bonding interface.

Figures 4A, 4B:
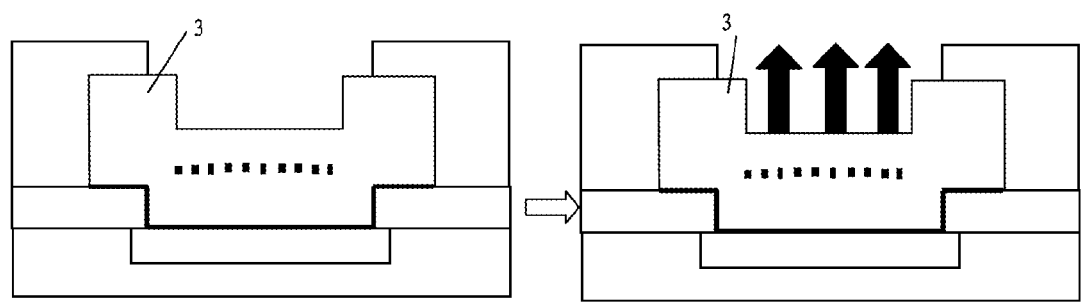
FIG. 4A is a cross section view illustrating the exemplary semiconductor device of FIG. 2C disposed in a tensile stress testing apparatus.
FIG. 4B is a cross section view illustrating the reduction in aluminum pad layer peeling when a tensile stress is applied to the exemplary semiconductor device of FIG. 2C.

FIG. 4A is a cross section view illustrating the exemplary semiconductor device of FIG. 2C disposed in a tensile stress testing apparatus.

FIG. 4B is a cross section view illustrating the reduction in aluminum pad layer peeling when a tensile stress is applied to the exemplary semiconductor device of FIG. 2C.

When the same tensile stress testing conditions are applied in the examples of FIGS. 1B and 4B, it may be observed that aluminum pad layer peeling may be significantly reduced in the exemplary semiconductor device of FIG. 2C compared to the semiconductor device of FIG. 1B. In some embodiments, the aluminum pad layer peeling may be reduced from about 15% (for the semiconductor device of FIG. 1B) to less than about 1% (for the exemplary semiconductor device of FIG. 2C). Accordingly, the stability of the electrical and mechanical bond between the aluminum pad layer and the underlying metal layer can be improved using the exemplary semiconductor device of FIG. 2C. Therefore, the exemplary semiconductor device of FIG. 2C has improved reliability compared to the semiconductor device of FIG. 1B.

The present inventive concept has been described with reference to the above embodiments. However, one of ordinary skill in the art would recognize that various modifications may be made to the described embodiments without departing from the scope of the present disclosure. The technical specification and the drawings are merely illustrative and should not be construed as limiting the scope of the inventive concept.

What is claimed is:

1. A method for forming a semiconductor device, comprising:
    forming a first aluminum pad layer on a metal layer;
    forming an adhesion layer on the first aluminum pad layer;
    etching the adhesion layer so as to form a patterned adhesion layer;
    forming a second aluminum pad layer on the first aluminum pad layer and the patterned adhesion layer; and
    reducing a width of the first aluminum pad layer after a plurality of spaced portions of the patterned adhesion layer has been formed, wherein the first aluminum pad layer is wider than the patterned adhesion layer after the reducing.

2. The method according to claim 1, wherein the adhesion layer includes at least one of titanium, tantalum, and tantalum nitride, and wherein a thickness of the first aluminum pad layer is about 1/5 to about 1/3 of a total thickness of the first aluminum pad layer and the second aluminum pad layer.

3. The method according to claim 1, wherein the second aluminum pad layer directly contacts more than two spaced portions of the patterned adhesion layer.

4. The method according to claim 1, wherein the adhesion layer is etched using at least one of a wet etching process and a dry etching process.

5. The method according to claim 4, wherein the wet etching process includes an alkali solution having a $H_2O_2$ additive, and the wet etching process has an etch rate of about 20 A-100 A/min.

6. The method according to claim 4, wherein the dry etching process includes a fluorine-containing chemical substance.

7. The method according to claim 6, wherein the fluorine-containing chemical substance includes at least one of $CF_4$, $CHF_3$, and $CH_2F_2$.

8. The method according to claim 1, wherein the patterned adhesion layer includes a plurality of annular patterns or a serpentine line pattern.

9. The method according to claim 1, wherein a thickness of the adhesion layer is about 5 nm to about 50 nm.

10. The method of claim 1, further comprising repeatedly stacking a plurality of the first aluminum pad layers, a plurality of the patterned adhesion layers, and a plurality of the second aluminum pad layers.

11. A semiconductor device, comprising:
    a metal layer;
    a first aluminum pad layer positioned on the metal layer;
    a patterned adhesion layer positioned on the first aluminum pad layer; and
    a second aluminum pad layer positioned on and directly contacting both the first aluminum pad layer and the patterned adhesion layer, wherein a portion of the second aluminum pad layer is positioned between two portions of the patterned adhesion layer, wherein the portion of the second aluminum pad layer directly contacts both the two portions of the patterned adhesion layer and directly contacts a portion of the first aluminum pad layer, and wherein the portion of the first aluminum pad layer is positioned between the portion of the second aluminum pad layer and the metal layer in a direction perpendicular to the metal layer.

12. The semiconductor device according to claim 11, wherein a thickness of the first aluminum pad layer is about 1/5 to about 1/3 of a total thickness of the first aluminum pad layer and the second aluminum pad layer.

13. The semiconductor device according to claim 11, wherein the patterned adhesion layer includes at least one of titanium, tantalum, and tantalum nitride.

14. The semiconductor device according to claim 11, wherein a plurality of portions of the patterned adhesion layer and a plurality of portions of the second aluminum pad layer are alternately positioned.

15. The semiconductor device according to claim 11, wherein the second aluminum pad layer directly contacts more than two spaced portions of the patterned adhesion layer.

16. The semiconductor device according to claim 11, wherein the patterned adhesion layer comprises a serpentine structure, and wherein the serpentine line structure encloses no portion of the second aluminum pad layer.

17. The semiconductor device according to claim 11, wherein more than two spaced portions of the patterned adhesion layer are positioned between two portions of the first aluminum pad layer.

18. The semiconductor device according to claim 11, wherein a thickness of the patterned adhesion layer is about 5 nm to about 50 nm.

19. The semiconductor device of claim 11, further comprising a plurality of the first aluminum pad layers, a plurality of the patterned adhesion layers, and a plurality of the second aluminum pad layers repeatedly stacked.

20. A semiconductor device, comprising:
   a metal layer;
   a aluminum pad positioned on the metal layer; and
   a patterned adhesion layer comprising a first adhesion layer portion and a second adhesion layer portion, wherein the first adhesion layer portion is spaced from the second adhesion layer portion, and wherein the aluminum pad directly contacts four sides of the first adhesion layer portion and directly contacts four sides of the second adhesion layer portion.

* * * * *